(12) United States Patent
Qin

(10) Patent No.: US 9,791,480 B2
(45) Date of Patent: Oct. 17, 2017

(54) CURRENT SENSING OF SWITCHING POWER REGULATORS

(71) Applicant: ANALOG DEVICES GLOBAL, Hamilton (BM)

(72) Inventor: Song Qin, Shanghai (CN)

(73) Assignee: ANALOG DEVICES GLOBAL, Hamilton (BM)

( * ) Notice: Subject to any disclaimer, the term of this patent is extended or adjusted under 35 U.S.C. 154(b) by 1104 days.

(21) Appl. No.: 13/899,143

(22) Filed: May 21, 2013

(65) Prior Publication Data

US 2014/0347078 A1    Nov. 27, 2014

(51) Int. Cl.
  *G01R 19/00* (2006.01)
  *H02M 3/158* (2006.01)
  *H02M 1/00* (2006.01)

(52) U.S. Cl.
  CPC ........ *G01R 19/0092* (2013.01); *H02M 3/158* (2013.01); *H02M 2001/0009* (2013.01)

(58) Field of Classification Search
  CPC ............. G01N 1/44; G01N 2021/0328; G01N 27/4143; G01N 27/023; G01S 17/026; G01R 19/0092; G01R 27/08; G01R 31/2621
  USPC ...... 324/500, 600, 703–714, 762.08, 762.09, 324/750.03, 750.28, 760.02, 750.01
  See application file for complete search history.

(56) References Cited

U.S. PATENT DOCUMENTS

| | | | |
|---|---|---|---|
| 6,271,695 B1 * | 8/2001 | Gramegna | ................ H03F 1/22 327/110 |
| 7,106,042 B1 | 9/2006 | Jackson | |
| 7,282,894 B2 | 10/2007 | Oswald et al. | |
| 7,319,314 B1 | 1/2008 | Maheshwari et al. | |
| 7,336,085 B2 | 2/2008 | Fabbro et al. | |
| 7,365,559 B2 | 4/2008 | Colbeck | |
| 8,080,984 B1 | 12/2011 | Geynet | |
| 8,159,204 B2 | 4/2012 | Grant | |
| 8,350,543 B2 | 1/2013 | Loikkanen et al. | |
| 8,373,398 B2 | 2/2013 | Kim | |
| 8,508,207 B2 | 8/2013 | Burns et al. | |
| 8,513,935 B2 | 8/2013 | Brokaw | |
| 8,680,836 B2 | 3/2014 | Grant | |
| 8,937,467 B2 | 1/2015 | Qin | |
| 9,046,905 B2 | 6/2015 | Qin | |
| 2004/0189351 A1 | 9/2004 | Tai et al. | |
| 2006/0255783 A1 | 11/2006 | Chapuis | |
| 2008/0278234 A1 * | 11/2008 | Haila | .................... H03F 3/3001 330/264 |

(Continued)

*Primary Examiner* — Melissa Koval
*Assistant Examiner* — Trung Nguyen
(74) *Attorney, Agent, or Firm* — Knobbe, Martens, Olson & Bear, LLP

(57) ABSTRACT

Apparatus and methods for current sensing in switching regulators include a current sensing circuit to sense current of a power stage of a power converter. The power converter can include first and second transistors. The current sensing circuit comprises a transistor that is a scaled version of one of the transistors of the power converter. A circuit of the current sensing circuit matches a drain-to-source voltage of the transistor of the current sensing circuit to the corresponding transistor of the power converter. A current mirror generates a current that mirrors the current flowing through the transistor of the current sensing circuit. A first resistor converts the mirrored current to a current sensed signal.

20 Claims, 5 Drawing Sheets

(56) References Cited

U.S. PATENT DOCUMENTS

2011/0101934 A1    5/2011   Lopata et al.
2013/0293986 A1   11/2013   Lerner et al.
2014/0009190 A1    1/2014   Chao

* cited by examiner

CURRENT SENSING OF SWITCHING POWER REGULATORS

BACKGROUND

Field

Embodiments of the invention relate to electronic devices, and more particularly, to switching regulators.

Description of the Related Technology

A switching regulator can be used to generate a regulated voltage by controlling a current provided to a load through an inductor. For example, the switching regulator can include one or more switches that are turned on and off. The duty cycle and/or timing of the switches can control the voltage level of the regulated voltage. Examples of switching regulators include, for example, buck converters and boost converters.

A switching regulator can include current sensing or observation circuitry to sense the current through one or more of the regulator's switches, thereby sensing the current provided to the load through the inductor. The sensed switch current can be used to provide enhanced control over switching operations in the regulator.

There is a need for improved current sensing circuits in switching regulators.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section titled "Detailed Description," one will understand how the features of this invention provide advantages that include improving power efficiency of power regulators by reducing power losses of current sensing circuits.

In one embodiment, an apparatus is disclosed. The apparatus comprises a current sensing circuit configured to sense current of a power stage of a power converter comprising a first transistor and a second transistor. The current sensing circuit comprises a third transistor having a gate, a drain, and a source. The gate of the third transistor is operatively coupled to a gate of the second transistor. The third transistor is a scaled version of the second transistor. The current sensing circuit further comprises a first circuit configured to match a drain-to-source voltage of the third transistor with a drain-to-source voltage of the second transistor. The current sensing circuit further comprises a current mirror configured to mirror current flowing through the third transistor. The current sensing circuit further comprises a first resistor configured to convert the mirrored current to a current sensed signal.

In another embodiment, a method of sensing a current of a power converter is disclosed. The method comprises providing a gate of a sensing transistor with a voltage corresponding to a gate voltage of a power transistor of the power converter. The sensing transistor is a scaled version of the power transistor. The method further comprises controlling a drain-to-source voltage of the sensing transistor to match a drain-to-source voltage of the power transistor. The method further comprises generating an output current based at least partly on current flowing through the sensing transistor by using a current mirror such that the output current is a scaled version of the current flowing through the sensing transistor. The method further comprises converting the output current to a current sensed signal by using a first resistor.

In another embodiment, an apparatus for sensing a current of a power converter is disclosed. The apparatus comprises means for providing a gate of a sensing transistor a voltage corresponding to a gate voltage of a power transistor of the power converter. The sensing transistor is a scaled version of the power transistor. The apparatus further comprises means for controlling a drain-to-source voltage of the sensing transistor to match a drain-to-source voltage of the power transistor. The apparatus further comprises means for generating an output current based at least partly on current flowing through the sensing transistor, wherein the output-current generating means includes a current mirror such that the output current is a scaled version of the current flowing through the sensing transistor. The apparatus further comprises means for converting the output current to a current sensed signal.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1:
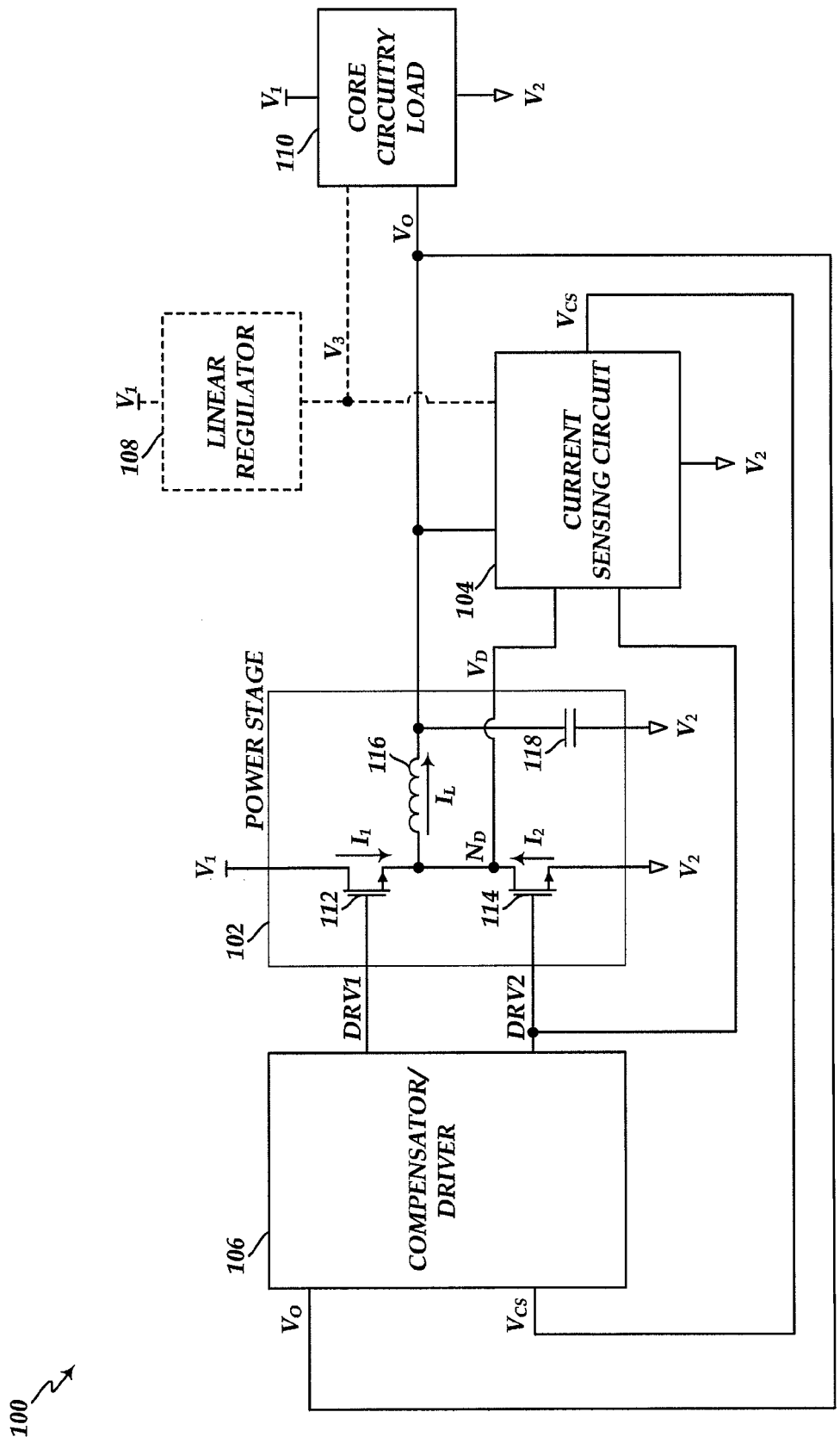
FIG. 1 is a schematic block diagram illustrating a closed-loop switching regulator system.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Embodiments are described in the context of systems and methods for sensing drive or output current of buck regulators, but will be applicable to other types of switching regulators, such as boost and buck-boost converters. In one embodiment, a current sensing circuit senses current of a power stage of a power converter, such as a buck regulator. For example, the power converter can include a high-side power transistor or switch and a low-side power transistor or switch that are independently switched on and off to convert an input voltage to a regulated output voltage. The current sensing circuit includes a sensing transistor that is a (scaled) version of one of the power transistors, and includes a voltage matching circuit. The matching circuit controls a voltage of a terminal of the sensing transistor so that the voltages of the sensing transistor match the corresponding power transistor. Because the sensing transistor is a version of the power transistor, the current flowing through the sensing transistor is a version of the current flowing through the power transistor. Matching can be done with same polarity or reverse polarity to control the direction of the sensing transistor current. The sensing circuit can further include a current mirror to generate a mirrored current of the sensing transistor current. In some embodiments, a current sensed signal can be generated by passing the mirrored current through a resistor to generate a voltage that is related to the switch current.

In some embodiments, the current sensing circuit can have reduced power losses and improved efficiency. For example, one drawback of certain current sensing circuits is power loss due to, in part, using inefficient power supplies to power, supply, or bias the current sensing circuit. For example, high current buck switching regulators (such as point of load regulators) can use a power metal oxide semiconductor field effect transistor (MOSFET) having a low on-resistance $R_{ON}$ as the low-side power switch. The sensing transistor can be sized N times smaller than the power MOSFET. But if the input voltage directly or indirectly (through a linear regulator) supplies current to the sensing transistor, power dissipation can be large even though the current of sensing transistor is only a fraction of the power MOSFET current. For example, where the input voltage is 12 volts (V), the sensing ratio N is 500, the output voltage is 1.2 V, and the output current is 10 amperes (A), the duty cycle is about 10% and the average low side current is about 9 A. Accordingly, the current of the sensing transistor is about 9/500 A (or about 18 mA). In turn, power loss due to the current sensing circuit can be calculated to be about 216 milliwatts (mW) and as having 1.8% efficiency loss with respect to the output power of the regulator.

While power dissipation can be reduced by increasing the sensing ratio N, there can be practical limitations to this approach. For example, increasing the sensing ratio N also degrades sensing accuracy due to, for example, decreased signal to noise ratio resulting from decreased current levels. Because of sensing accuracy considerations, power dissipation may only be reducible to a limit by the selection of the sensing ratio N alone. Thus, there is a need for improved current sensing circuits in switching regulators.

In certain embodiments, efficiency can be improved by powering, supplying, and/or biasing the sensing transistor with the switching regulator. In comparison with a linear regulator, the switching regulator is relatively efficient (for example, linear regulators can step down voltage by dissipating power). In one specific example, the current sensing circuit is supplied current by the switching regulator alone, without additional power supplies. For example, the currents flowing through the sensing transistor, the matching circuit, and the current mirror are supplied by the switching regulator. In another specific example, the current sensing circuit is supplied current partially by the switching regulator and partially by the input voltage and/or a linear regulator. For example, the current flowing through the sensing transistor and the matching circuit can be supplied by the switching regulator and the current flowing through the current mirror can be supplied by a separate supply, such as the input voltage and/or a linear regulator. In another example, current flowing through the sensing circuit can be partially supplied by the switching transistor and partially supplied by the input voltage and/or a linear regulator.

As previously stated, configuring the current sensing circuit to be powered, supplied, and/or biased, at least partially, by the switching regulator can aid in reducing losses and improving the efficiency of the current sensing circuit. This can be true in some situations because, for example, the output voltage of the switching regulator can be lower than the input voltage. Additionally or alternative, the output voltage of the switching regulator can be an efficient power rail in comparison to power rails powered with linear regulators.

FIG. 1 is a schematic block diagram illustrating a closed-loop switching regulator system 100. The closed-loop switching regulator system 100 includes a power stage 102, a current sensing circuit 104, a feedback compensator/driver 106 ("driver"), an optional linear regulator 108, and a core circuitry load 110. The power stage 102 includes one or more power transistors, such as a high-side transistor 112 and a low-side transistor 114, as well as an output inductor 116 and an output capacitor 118.

The power stage 102 is configured to receive a first drive control DRV1 and a second drive control DRV2 as inputs and a first supply voltage $V_1$ and a second supply voltage $V_2$ as power supplies, and is configured to generate an output voltage $V_O$ as an output power supply. The power stage 102 can generate the output voltage $V_O$ at a variable level, in accordance with the first and second drive controls DRV1, DRV2, by converting the received first and second supply voltages $V_1$, $V_2$. For example, in the illustrated embodiment the high-side transistor 112 of the power stage 102 includes a gate configured to receive the first drive control DRV1, a drain configured to receive a first supply voltage $V_1$ (for example, from a positive power rail), and a source electrically connected to a first end of the output inductor 116 and to a drain of the low-side transistor 114 (for example, at a node $N_D$). The low-side transistor 114 includes a gate configured to receive the second drive control DRV2, a drain electrically connected to the source of the high-side transistor 112 and the first end of the output inductor 116 (for example, at the node $N_D$), and a source configured to receive the second supply voltage $V_2$ (for example, from a negative supply rail or ground). The output inductor 116 further includes a second end electrically connected to an output of the power stage 102 to provide the output voltage $V_O$. The output capacitor 118 is electrically disposed between the second end of the output inductor 116 and the second supply voltage $V_2$. The generated output voltage $V_O$, for example, can be effective for powering a circuit, device, or load, such as the core circuitry load 110.

In operation, the first and second drive controls DRV1, DRV2 turn on and off the high-side and low-side transistors 112, 114 to generate a variable output voltage $V_O$ by controlling an inductor current $I_L$ through the output inductor 116. In certain implementations, the first and second drive controls DRV1, DRV2 can be used to regularly switch the state of the high-side and low-side transistors 112, 114 between a first phase and a second phase of the power stage 102. For example, during the first phase of the power stage 102, the high-side transistor 112 can be on and the low-side transistor 114 can be off to increase or build up the magnetic field of the output inductor 116 by providing a switch current $I_1$ from the first supply voltage $V_1$ to a load (for example, the core circuitry load 110) through the output inductor 116. During the second phase of the power stage 102, the high-side transistor 112 can be off and the low-side transistor 114 can be on such that inductor's magnetic field operates to provide a switch current $I_2$ from the second supply voltage $V_2$ to the load through the output inductor 116. During switching between the first and second phases, the output capacitor 118 can prevent an instantaneous change in the output voltage $V_O$. Applicable inductances of the output inductor 116 and applicable capacitances of the output capacitor 118 will be readily determined by one of ordinary skill in the art.

Although the power stage 102 has been described as selectively operating in two phases, the power stage 102 can operate in additional phases. For example, in one embodiment, the power stage 102 can selectively operate in the first phase, the second phase, and a third phase.

In certain implementations, the high-side and low-side transistors 112, 114 are implemented as metal oxide semiconductor (MOS) transistors, such as vertical diffused MOS (DMOS) transistors. As used herein and as persons having ordinary skill in the art will appreciate, MOS transistors can have gates made out of materials that are not metals, such as polysilicon, and can have dielectric regions implemented not just with silicon oxide, but also with other dielectrics, such as high-k dielectrics.

The high-side and low-side transistors 112, 114 are illustrated as n-type MOS (NMOS) transistors. However, the teachings herein are applicable to configurations using p-type MOS (PMOS) transistors and/or configurations using a combination of NMOS and PMOS transistors. For example, in certain implementations, the high-side transistor 112 can be implemented as a PMOS transistor and the low-side transistor 114 can be implemented as an NMOS transistor.

In one embodiment, the power stage 102 corresponds to a power stage 102 of buck converter. The power stage 102, however, can be any applicable type of power stage, including a boost-type power stage. The choice of the type of the power stage will depend on the application, as will be appreciated by one skilled in the art.

The current sensing circuit 104 is configured to receive the switch voltage $V_D$ of the low-side transistor 114 and the second drive control DRV2 as inputs, is configured to receive the output voltage $V_O$ of the power stage 102 as well as the first and second supply voltages $V_1$, $V_2$ and a third supply voltage $V_3$ as power supplies, and is configured to generate the current sensed signal $V_{CS}$ as an output. In the illustrated embodiments, the current sensed signal $V_{CS}$ corresponds to a voltage signal representative of the sensed current. For example, the current sensing circuit 104 of FIG. 1 is electrically connected to the power stage 102 and the driver 106 to receive the switch voltage $V_D$ and the second drive control DRV2. The current sensing circuit 104 can be configured to sense the switch current $I_2$ of the low-side transistor 114 based at least partly on the switch voltage $V_D$ and the second drive control DRV2. Thus, the current sensing circuit 104 can sense the approximate inductor current $I_L$ through the output inductor 116 when the low-side transistor 114 is on and the high-side transistor 112 is off. The current sensing circuit 104 can be configured to generate the current sensed signal $V_{CS}$ in relation to the sensed inductor current $I_L$ (by way of sensing the switch current $I_2$) when the low-side transistor 114 is on and the high-side transistor 112 is off. Various embodiments of the current sensing circuit 104 will be described in further detail later in connection with FIGS. 2-5.

The current sensed signal $V_{CS}$ can aid in monitoring the performance of the power stage 102. Such monitoring can be beneficial, for example, for overload protection, for output control, fault detection, and/or failure prevention of the power stage 102, among other functions.

FIG. 1 illustrates the current sensing circuit 104 in the context of a switching regulator implemented in a buck converter configuration. In addition, the teachings herein are applicable to other implementations of switching regulators, including, for example, boost converter configurations. Thus, the teachings herein are applicable to switching converters that generate not only a buck or step-down voltage, but also to switching converters that generate a boost or step-up voltage.

The power stage 102 and the current sensing circuit 104 form an output portion of the switching regulator system 100 for providing the output voltage $V_O$ as well as the switch voltage $V_D$. Various embodiments of the output portion will be described in further detail with reference to FIGS. 2-5.

The driver 106 is configured to receive the output voltage $V_O$ of the power stage 102 and the current sensed signal $V_{CS}$ as inputs and is configured to generate the first and second drive controls DRV1, DRV2 as outputs. For example, the driver 106 of the illustrated embodiment can generate the first and second drive controls DRV1, DRV2 based on the output voltage $V_O$ and the current-sensed voltage $V_{CS}$ to regulate or control the output voltage $V_O$. In certain embodiments, the driver 106 can be configured to receive, or generate internally, a reference voltage $V_{REF}$ (not shown). The reference voltage $V_{REF}$ can indicate an intended or desired voltage of the output voltage $V_O$ of the power stage 102. To track approximately the reference voltage $V_{REF}$, the driver 106 can include one or more compensators (not shown) disposed in corresponding feedback paths, such as a voltage feedback path and/or a current feedback path, for aiding in the generation of the first and second drive controls DRV1, DRV2. The driver 106 can be configured to operate in a voltage mode, a current mode, and the like compensation modes. Furthermore, the current mode compensation can include peak current mode control, valley current mode control, emulated current mode control, hysteretic current mode control, and the like current mode controls.

Although not illustrated for the sake of clarity, the driver 106 of FIG. 1 can include switch control circuitry for generating the first and second drive controls DRV1, DRV2. For example, the driver 106 can include a pulse width modulator (not shown) configured to pulse width modulate the first and second drive controls DRV1, DRV2. Additionally, the driver 106 can be configured to generate restrictively the first and second drive controls DRV1, DRV2 in only permissible states. For example, the driver 106 can be configured to prevent the high-side and low-side transistors 112, 114 from being on at the same time. In certain implementations, the driver 106 can include control circuitry configured to operate based on the current sensed signal $V_{CS}$.

In one embodiment, the current sensing circuit 104 is powered from the generated output voltage $V_O$ or from the first supply voltage $V_1$. In alternative embodiments, the optional linear regulator 108 is configured to receive the first supply voltage $V_1$ as a power supply and is configured to generate the third supply voltage $V_3$ as an output. For example, the optional linear regulator 108 can generate the third supply voltage $V_3$ (for example, $V_{DD}$) for provisioning a supply voltage different from the output voltage $V_O$. For example, the power stage 102 can be configured to provide a low voltage supply and the linear regulator can be configured to provide an intermediary supply voltage relative to the first supply voltage $V_1$ and the output voltage $V_O$. Examples of types of linear regulators include passive linear regulators, active linear regulators, and the like as appreciated by one skilled in the art.

In certain embodiments, the third supply voltage $V_3$ can correspond to the first supply voltage $V_1$. For example, the linear regulator 108 can correspond to an electrical path that provides the first supply voltage $V_1$ to the current sensing circuit 104. In other embodiments, the third supply voltage $V_3$ can be omitted. For example, in a certain embodiment, the current sensing circuit 104 can be powered or biased entirely by the output voltage $V_O$ of the power stage 102.

As stated, the current sensing circuit 104 can be supplied power or biased from various power supplies, such as the first, second, and third supply voltages $V_1$, $V_2$, $V_3$ and the output voltage $V_O$ of the power stage 102. The output voltage $V_O$ can provide an efficient power rail in comparison with the first and third supply voltages $V_1$, $V_3$. For example, linear regulators can consume the difference between the input voltage and the regulated voltage (for example, $V_1$-$V_3$), resulting in inefficiency. In some embodiments, the output voltage $V_O$ is used to completely supply the current sensing circuit 104 alone. For example, this may be possible where the output voltage $V_O$ is sufficiently large (for example, $V_O$>2 V) for powering the current sensing circuit while providing enough headroom for powering the core circuitry load 110.

As shown in FIG. 1, in some embodiments, the first and third supply voltages $V_1$, $V_3$ can also be used as a power supply for the current sensing circuit 104, for instance, for low-current bias circuits. For example, the first and third supply voltages $V_1$, $V_3$ can be used to supply the current sensing circuit 104, either separately or supplementally, with the output voltage $V_O$. In doing so, the output voltage $V_O$ can be a relatively low voltage supply (for example, 0.5 V or lower), but can have a voltage in a very broad range.

The core circuitry load 110 is configured to receive the first, second, and third voltage supplies $V_1$, $V_2$, $V_3$ and the output voltage $V_O$ as power supplies. The core circuitry load 110 can correspond to circuits configured to perform, for example, various functions related to electronic devices, electromechanical devices, electro-optical devices, electro-chemical devices, and the like devices.

In one embodiment, the power stage 102, the current sensing circuit 104, the driver 106, the linear regulator, and the core circuitry load 110, as well as subcomponents thereof, are implemented on an integrated circuit. However, other configurations are possible. For example, the output inductor 116, the output capacitor 118, and the core circuitry load 110 are implemented external to the integrated circuit that includes the remaining components of the switching regulator system 100.

Figure 2:
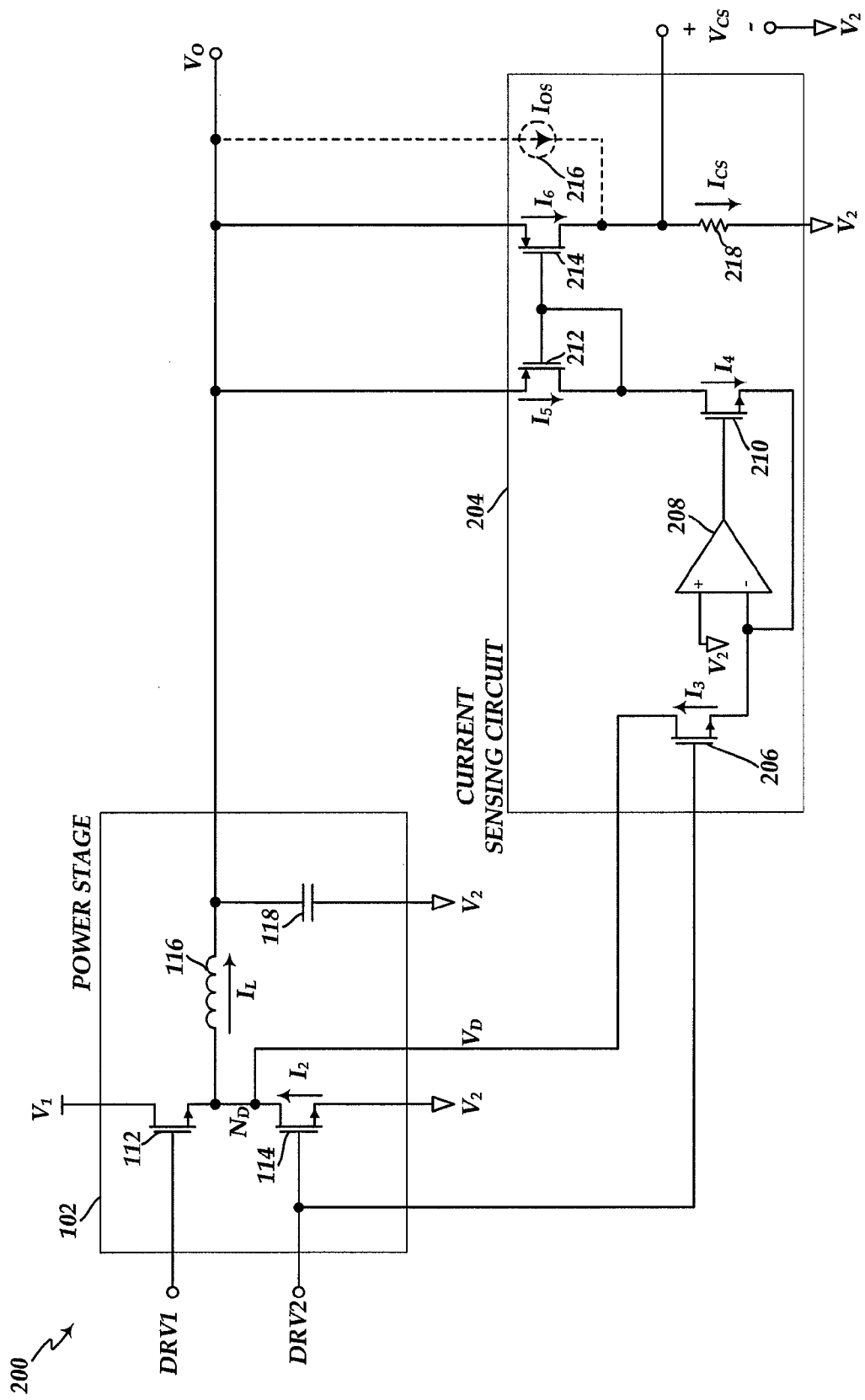
FIG. 2 is a schematic circuit diagram illustrating one embodiment of an output portion of the switching regulator system including a current sensing circuit and the power stage of FIG. 1.

FIG. 2 is a schematic circuit diagram illustrating one embodiment of an output portion 200 of the switching regulator system 100 including a current sensing circuit 204 and the power stage 102 of FIG. 1. Elements of FIG. 2 common to FIG. 1 share common reference indicia, and only differences between FIGS. 1 and 2 are described herein for the sake of brevity. The current sensing circuit 204 includes a sensing transistor 206, a first amplifier 208, a transistor 210, first and second mirror transistors 212, 214, an offset current source 216, and a sensing resistor 218.

The sensing transistor 206 can include a gate configured to receive the second drive control DRV2, a drain configured to receive the switch voltage $V_D$, and a source configured to receive a voltage corresponding the second supply voltage $V_2$. For example, the illustrated embodiment shows the sensing transistor 206 as having its gate electrically connected to the second drive control DRV2, the drain electrically connected to the node $N_D$ of the power stage 102, and the source electrically connected to a matching circuit formed of the first amplifier 208 and the transistor 210. As described later in further detail, the matching circuit can be configured to provide the voltage corresponding to the second supply voltage $V_2$.

In certain implementations, the sensing transistor 206 is scaled in width relative to the low-side transistor 114. For example, the low-side transistor 114 can be sized with a width of about N times a width of the sensing transistor 206 such that the "on" resistance of the sensing transistor 206 is also about N times higher than the on resistance of the low-side transistor 114. The current $I_2$ flowing through the low-side transistor 114 can be indirectly observed by the voltage drop generated by the current $I_2$ and the on resistance of the low-side transistor 114. This voltage drop results in the switch voltage $V_D$, which is a negative voltage during operation with the low-side transistor 114 on. In operation, a sensing current $I_3$ can flow through the sensing circuit 204. For instance, the voltages of the gate, drain, and source of the sensing transistor 206 can be matched with the voltages of the gate, drain, and source of the low-side transistor 114. Thus, with the on resistances scaled by a factor of N, the switch current $I_2$ can be about equal to N*$I_3$. In one embodiment, N is selected to be about 100. In other embodiments, N is selected to be in the range of about 10 to about 10000. One benefit, among several, of selecting N to be much greater than 1 is that the sensing current $I_3$ can have a reduced impact on the inductor current $I_L$ relative to the switch current $I_1$. As one result, sensing the switch current $I_2$ can provide an effective indication of the inductor current $I_L$.

The first amplifier 208 (for example, an operational amplifier) and the transistor 210 can form the matching circuit, which can be configured to receive the second supply voltage $V_2$ as an input and to generate the voltage corresponding to the second supply voltage $V_2$ as an output. The generated voltage corresponding to the second supply voltage $V_2$ can be used to set the source voltage of the sensing transistor 206. For example, the illustrated embodiment shows that the first amplifier 208 can have a first input (for example, the non-inverting input) configured to receive the second supply voltage $V_2$, a second input electrically connected to the source of the sensing transistor 206. Further, the transistor 210 can have a gate electrically connected to the first amplifier 208 and a source electrically connected to a second input (for example, the inverting input) of the first amplifier 208, forming a feedback loop with the first amplifier 208 and the transistor 210.

In operation, the first amplifier 208 is in a feedback loop such that the first amplifier 208 can control the voltage at the gate of the transistor 210 such that the voltage at the source of the transistor 210, which is provided as an input to the second input of the first amplifier 208 matches with the second supply voltage $V_2$ which is provided as an input to the first input of the first amplifier 208. If the source of the sensing transistor 206 is set to the second supply voltage $V_2$, then the sensing current $I_3$ can be a version of the switch current $I_2$ with a scaling based on the sizing of the low-side transistor 114 relative to the sensing transistor 206. In addition, the sensing current $I_3$ will flow across the transistor 210 as a drain-to-source current $I_4$.

The first and second mirror transistors 212, 214 can form a current mirror configured to receive the sensing current $I_3$ (by way of the current $I_4$ flowing across the transistor 210) as an input and to generate a mirrored current $I_6$. The first mirror transistor 212 is diode connected. For example, the first mirror transistor 212 can be a scaled version or an unscaled version of the second mirror transistor 214 such that the current $I_5$ flowing through the first mirror transistor 212 can be approximately equal to a scaled version of the current $I_6$ flowing through the first mirror transistor 212. In various embodiments, a width of the first mirror transistor 212 can be selected to be about N times a width of the second mirror transistor 214. Thus, the mirrored current $I_6$ can be about equal to about $I_5/N$. In one embodiment, N is selected to be about 1. In other embodiments, N is selected to be in the range of about 0.1 to about 100.

In operation, the transistor 210 can cause the sensing current $I_5$ to flow through the first mirror transistor 212. In turn, the mirrored current $I_6$ flows through the second mirror transistor 214 of the current mirror and to a first end of the first sensing resistor 218. The first sensing resistor 218 can convert the mirrored current $I_6$ to a current sensed signal, such as the current sensed voltage $V_{CS}$. Thus, the first sensing resistor 218 is configured to change the current sensed voltage $V_{CS}$ in relation to the switch current $I_2$.

The first sensing resistor 218 can be implemented using a variety of configurations. For example, in certain implementations, the first sensing resistor 218 is implemented using passive structures, such as polysilicon structures. However, other configurations are possible, such as implementations in which the first sensing resistor 218 is implemented using active devices such as transistors biased to provide a desired resistance.

The first sensing resistor 218 can also been configured to receive an offset current $I_{OS}$ from the offset current source 216. Configuring the first sensing resistor 218 to receive the offset current $I_{OS}$ can aid in generating a voltage $V_{CS}$ above a minimum offset from $V_2$ even when the inductor current $I_L$ is approximately equal to zero.

As shown, the output voltage $V_O$ supplies the entire current sensing circuit 204 of FIG. 2. In one embodiment, the output voltage $V_O$ can be greater than about 1 V. In another embodiment, the output voltage can be in a range of about 3 to about 5 V. Other applicable values can be readily determined by one of ordinary skill in the art.

In certain implementations, the transistors 206, 210, 212, 214 of the current sensing circuit 204 are implemented as MOS transistors. In addition, the transistors 206, 210 of the current sensing circuit 204 are implemented by NMOS transistors and the transistors 212, 214 are implemented by PMOS transistors. However, the teachings herein are applicable to configurations using other combinations of NMOS and PMOS transistors.

Figure 3:
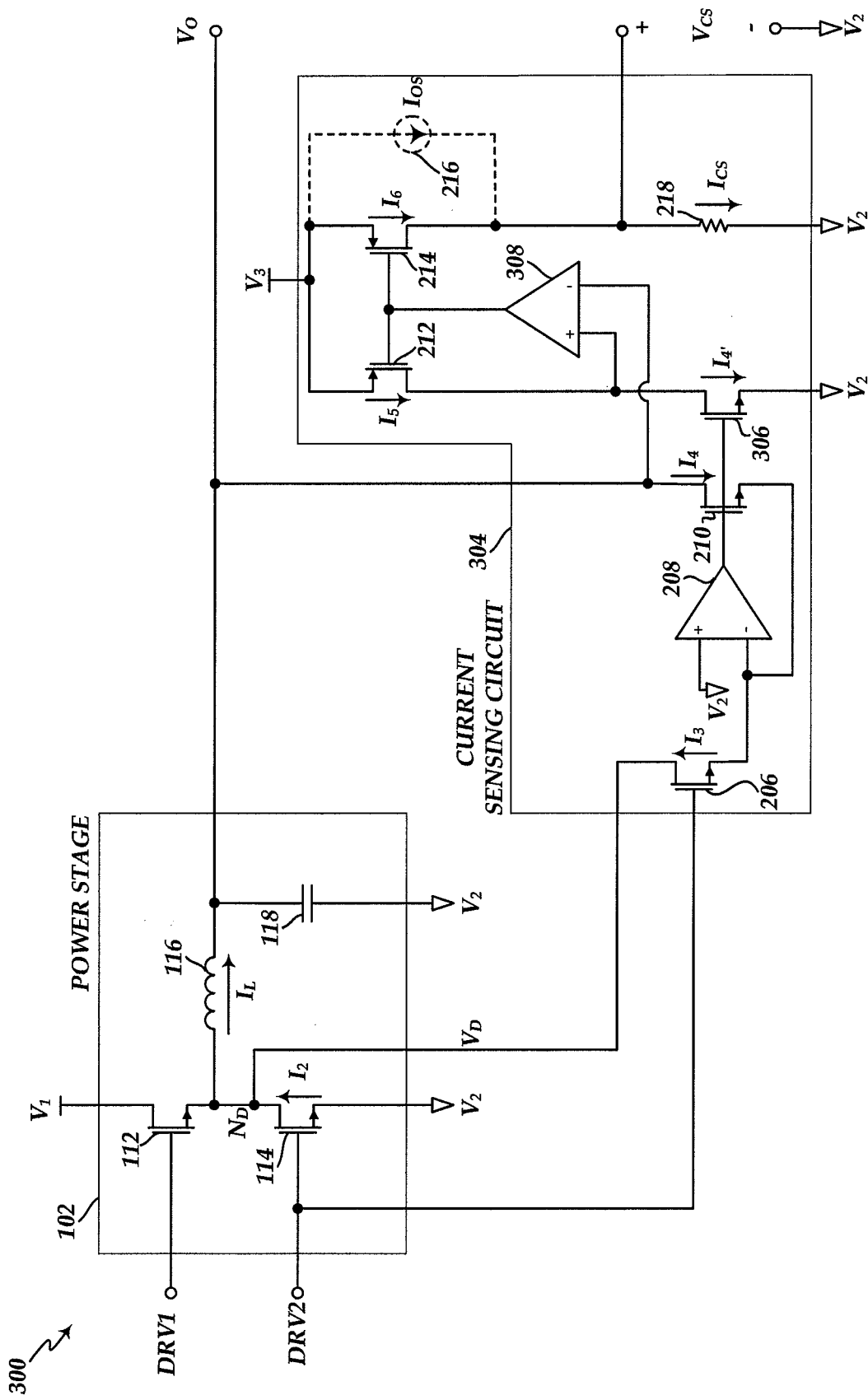
FIG. 3 is a schematic circuit diagram illustrating another embodiment of an output portion of the switching regulator system including a current sensing circuit and the power stage of FIG. 1.
Figure 4:
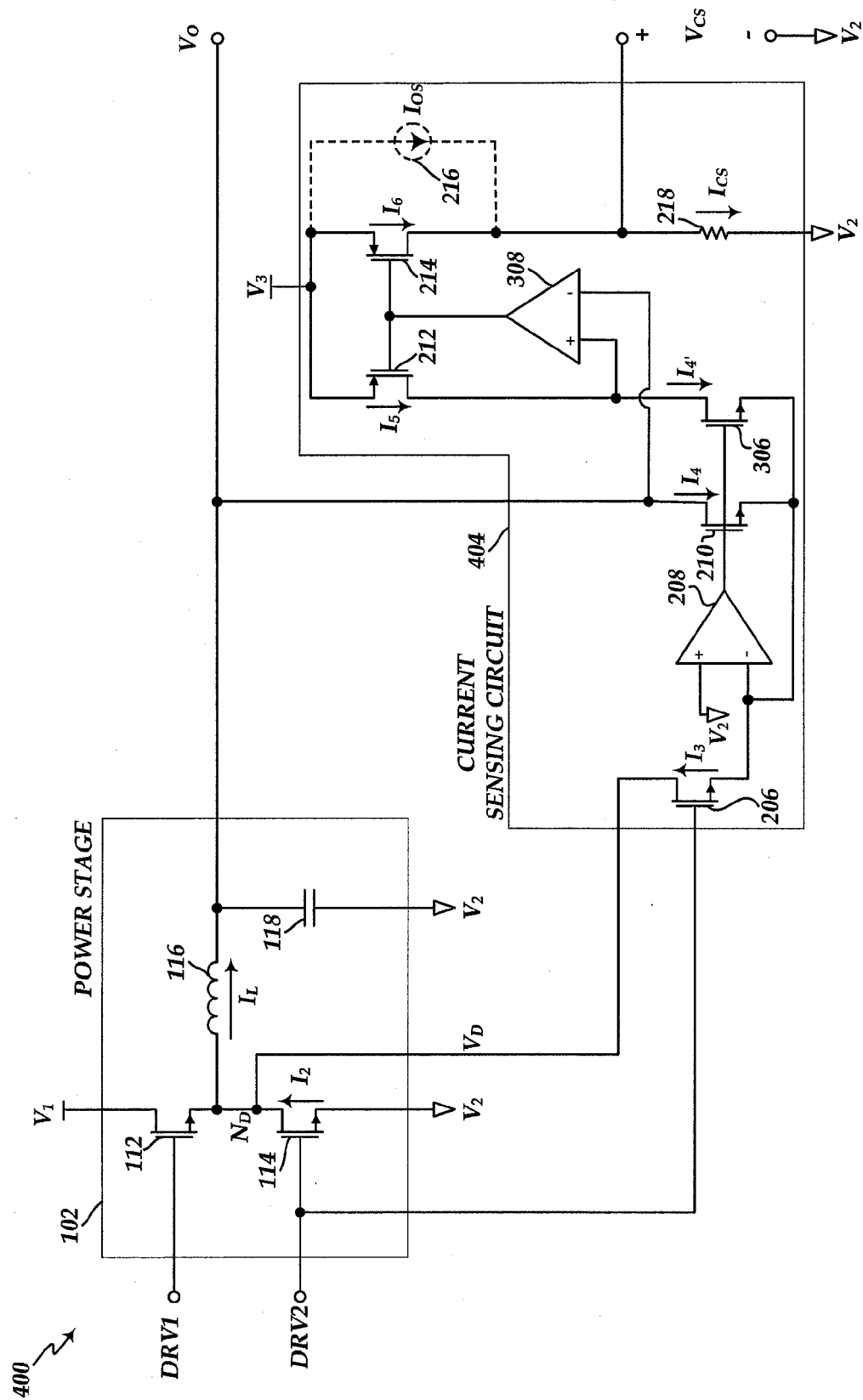
FIG. 4 is a schematic circuit diagram illustrating another embodiment of an output portion of the switching regulator system including a current sensing circuit and the power stage of FIG. 1.
Figure 5:
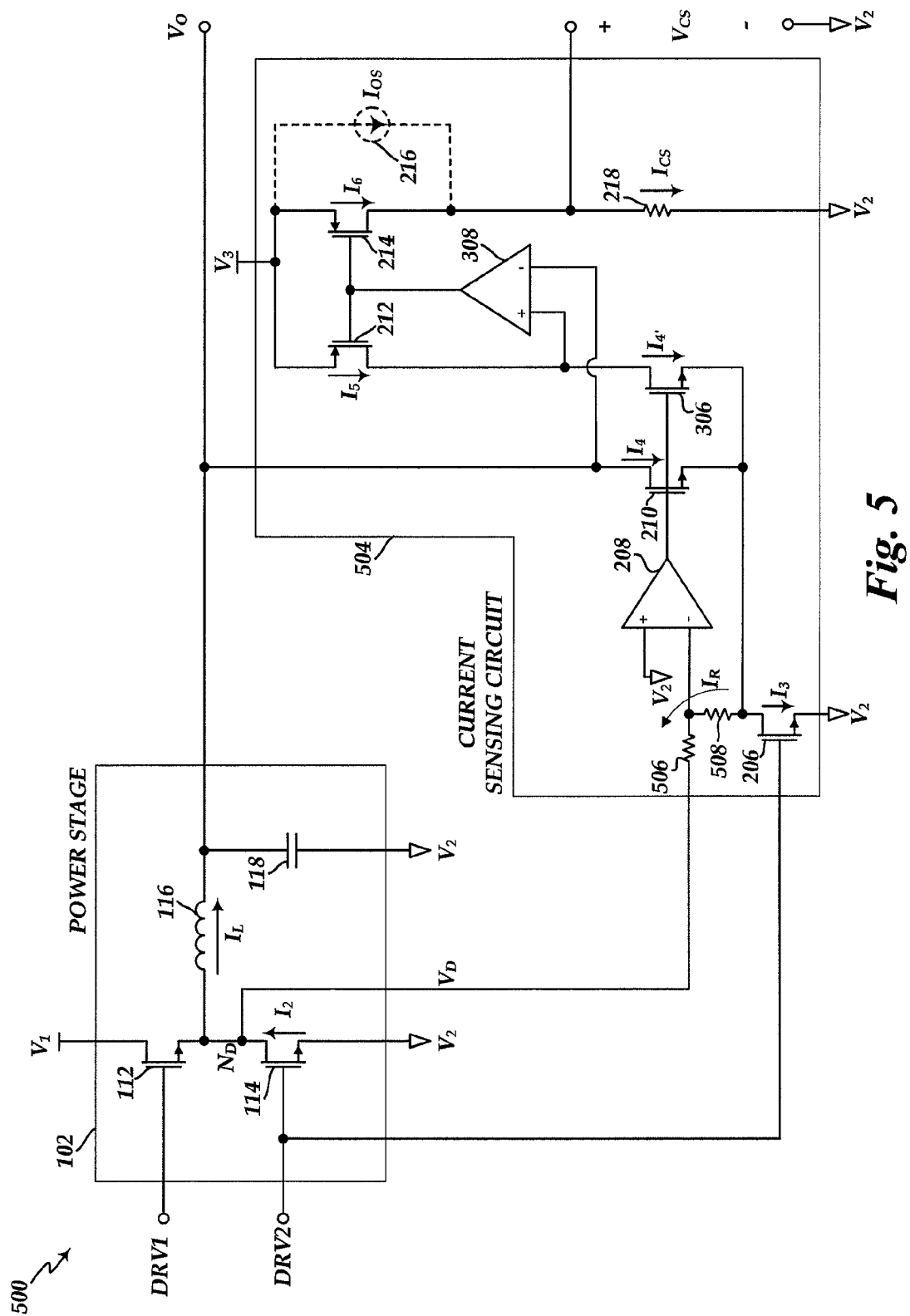
FIG. 5 is a schematic circuit diagram illustrating another embodiment of an output portion of the switching regulator system including a current sensing circuit and the power stage of FIG. 1.

FIGS. 3-5 are schematic circuit diagrams illustrating various embodiments of the output portion of the switching regulator system 100 including the current sensing circuit 104 and the power stage 102 of FIG. 1. Elements common to the embodiments share common reference indicia, and only differences between the embodiments are described herein for the sake of brevity.

FIG. 3 is a schematic circuit diagram illustrating one embodiment of an output portion 300 of the switching regulator system 100 including a current sensing circuit 304 and the power stage 102 of FIG. 1. The current sensing circuit 304 further includes another transistor 306 and a second amplifier 308.

In certain embodiments, the sensing transistor 206 and the matching circuit (the first amplifier 208 and the transistor 210) can be supplied current from a supply different from the supply of the first and second mirror transistors 212, 214. For example, in the illustrated embodiment the drain of the transistor 210 is electrically connected to the output voltage $V_O$. Thus, the current $I_3$ flowing through the sensing transistor 206 flows from the transistor 210 (as the current $I_4$) and, in turn, from the output voltage $V_O$.

In addition, the transistor 306 includes a drain and a source that forms a portion of an electrical pathway between the third and second supply voltages $V_3$, $V_2$. In certain implementations, the transistor 306 is scaled in size or drive strength relative to the transistor 210. For example, the transistor 306 can be sized with a width about M times a width of the transistor 210. In one embodiment, M is selected to be in the range of about 0.01 to about 10. However, other configurations are possible. One benefit, among several, of selecting M to be less than one is that reducing M reduces power dissipation by the portion of the circuit powered by the third supply voltage $V_3$.

The second amplifier 308 has a first (non-inverting) input electrically connected to the drain of the transistor 306 and a second (inverting) input electrically connected to the drain of the transistor 210. Furthermore, the second amplifier 308 has an output electrically coupled to the gates of the first and second mirror transistors 212, 214, thereby forming a feedback path around the output of the second amplifier 308 and the first input of the second amplifier 308. The second amplifier 308 can be implementable with any applicable amplifier, such as an operational amplifier.

In operation, the second amplifier 308 is in a feedback loop such that the second amplifier 308 can control its output such that its first input approximately matches its second input, thereby matching the drain voltage of the transistor 306 with the drain voltage of the transistor 210. Accordingly, the voltages of the gate, the drain, and the source of the transistor 306 can be matched with the voltages of the gate, the drain, and the source of the transistor 210. Thus, the transistor carries a current $I_{4'}$ that can about equal to $M*I_4$.

One benefit, among others, of the configuration of the current sensing circuit 304 as shown in FIG. 3 is that the current sensing circuit 304 can be effective in some situations in which the output voltage $V_O$ is relatively low. For example, the third supply voltage $V_3$ can supply currents $I_{4'}$ and $I_6$ regardless of the loading on the output voltage $V_O$.

In certain implementations, the transistor 306 of the current sensing circuit 304 is implemented as a MOS transistor. In addition, the transistor 306 of the current sensing circuit 304 is illustrated as an NMOS transistor. However, the teachings herein are applicable to configurations using a PMOS transistor.

FIG. 4 is a schematic circuit diagram illustrating one embodiment of an output portion 400 of the switching regulator system 100 including a current sensing circuit 404 and the power stage 102 of FIG. 1. In the illustrated embodiment, the source of the transistor 306 is electrically connected to the node with the sources of the sensing transistor 206 and of the transistor 210. Accordingly, the current $I_3$ flowing through the sensing transistor 206 can be partially supplied by the output voltage $V_O$ of the power stage 102 and can be partially supplied the third supply voltage $V_3$. The configuration and operation of the remaining portion of the current sensing circuit 404 are similar to the embodiment described in connection with FIG. 3.

Configuring the current sensing circuit 404 in the above-described switching manner can aid in increasing the accuracy of current sensing by attenuating an effect of an offset of the first amplifier 208. For example, in operation the inverting input of the first amplifier 208 can be offset from the non-inverting input of the first amplifier 208. As a result, the voltage of inverting input of the first amplifier 208 can be offset from the second supply voltage $V_2$. If in contrast to the illustrated embodiment of FIG. 4, the source of the transistor 306 is connected to the second supply $V_2$ rather than to the inverting input of the first amplifier 208, then the gate-to-source voltage of the transistor 210 can be offset from the gate-to-source voltage of the transistor 306. In turn, because the current $I_4$ can be offset from the current $I_{4'}$, sensing accuracy may be affected. However, as shown in the illustrated embodiment of FIG. 4, the sources of the transistors 210, 306 are both connected to the inverting input of the first amplifier 208. Accordingly, the gate-to-source voltage of the transistor 210 approximately matches the gate-to-source voltage of the transistor 306, and the current $I_4$ can be approximately proportional to the current $I_{4'}$. As a result, sensing accuracy can be improved.

FIG. 5 is a schematic circuit diagram illustrating one embodiment of an output portion 500 of the switching regulator system 100 including a current sensing circuit 504 and the power stage 102 of FIG. 1. The current sensing circuit 504 further includes a second sensing resistor 506 and a third sensing resistor 508.

In the illustrated embodiment, the gate of the sensing transistor 206 can be configured to receive the second drive control DRV2, and the source of the sensing transistor 206 can be configured to receive the second supply voltage $V_2$. The second sensing resistor 506 includes a first end configured to receive the switch voltage $V_D$ from the power stage 102. In addition, the second sensing resistor 506 further includes a second end that can be electrically connected to the second input of the first amplifier 208. The third sensing resistor 508 includes a first end electrically connected to the second input of the first amplifier 208 and to the second end of the second sensing resistor 506. The third sensing resistor 508 further includes a second end electrically connected to the drain of the sensing transistor 206, which is in turn electrically connected to the sources of the transistors 210, 306.

In operation, the first amplifier 208 operates in a feedback loop and controls its output such that the voltage of its second input matches the voltage of its first input (for example, $V_2$). The voltage created across the second sensing resistor 506 causes a current $I_R$ to flow through the second sensing resistor 506. Furthermore, the current $I_R$ flows through the third sensing resistor 508 and creates a voltage at the drain voltage of the sensing transistor 206. In one embodiment, the resistances of the second and third sensing resistors 506, 508 are about equal. The resistances of the second and third sensing resistors 506, 508 are not critical as the second and third sensing resistors 506, 508 are configured as a voltage divider. With the values of the resistances of the second and third sensing resistors 506, 508 about equal and the second supply voltage $V_2$ at ground, the feedback loop operates to place the opposite polarity of the switch voltage $V_D$ (a negative voltage when the low-side transistor 114 is on) at the second end of the second sensing resistor 506 such that the voltage at the inverting input of the amplifier 208 that corresponds to an intermediate node of the voltage divider matches with ground or zero volts. The drain voltage of the sensing transistor 206 can then match the drain voltage of the low-side transistor 114, but with opposite polarity (positive voltage). Based on the matching of the gate, source, and drain voltages and a scaling in width between the low-side transistor 114 and the sensing transistor 206, a current $I_3$ that has a magnitude of 1/N of the switch current $I_2$ flows through the sensing transistor 206 and causes the currents $I_4$ and $I_{4'}$ to flow through the transistors 210, 306, respectively. The configuration and operation of the remaining portion of the current sensing circuit 504 are similar to the embodiment described in connection with FIGS. 3 and 4.

The second and third sensing resistors 506, 508 can be implemented using a variety of configurations. For example, in certain implementations, the second and third sensing resistors 506, 508 are implemented using passive structures, such as polysilicon structures. However, other configurations are possible, such as implementations in which the second and third sensing resistors 506, 508 are implemented using active devices such as transistors biased to provide a desired resistance.

The various transistors of the foregoing description have been described as insulated gate field-effect transistors, such as MOSFETs. However, it will also be understood that the transistors can have various structural types other than MOSFETs, including, but not limited to, BJT, JFET, IGFET, MESFET, pHEMT, HBT, and the like transistor structural types. Further, the transistors described herein can also have various polarities, such as N-channel, P-channel, NPN-type, and PNP-type; and can include various semiconductor materials, such as Si, SiC, GaAs, SiGe, and the like.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, medical electronic products, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional. peripheral device, a wrist watch, a clock, etc. The medical electronic products can include, but are not limited to, a Digital-X-ray detector, a CT (Computed Tomography) scanner, an Ultrasounds system, a MRI (Magnetic Resonance Imaging) system, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus for sensing a current of a power converter, the apparatus comprising:
a power stage electrically coupled to a first supply, the power stage comprising a first transistor and a second transistor;
a current sensing circuit configured to sense current of the power stage, the current sensing circuit comprising:
a third transistor having a gate, a drain, and a source, wherein the gate of the third transistor is operatively coupled to a gate of the second transistor, wherein the third transistor is a scaled version of the second transistor;
a first circuit configured to match a drain-to-source voltage of the third transistor with a drain-to-source voltage of the second transistor;
a current mirror electrically coupled to a second supply and configured to provide a mirrored current mirroring current flowing through the third transistor, the mirrored current supplied by the second supply; and
a first resistor configured to convert the mirrored current to a current sensed signal.

2. The apparatus of claim 1, wherein the third transistor is configured to flow current from an output of the power converter.

3. The apparatus of claim 1, wherein the first circuit comprises:
a first amplifier having first and second inputs and an output, wherein the first input of the first amplifier is configured to receive a voltage corresponding to a voltage of a source of the second transistor, wherein the second input of the first amplifier is operatively coupled to the source of the third transistor; and
a fourth transistor having a gate, a drain, and a source, wherein the gate of the fourth transistor is operatively coupled to the output of the first amplifier, wherein the source of the fourth transistor is operatively coupled to the second input of the first amplifier in a feedback loop, and wherein the source of the fourth transistor is further operatively coupled to the source of the third transistor.

4. The apparatus of claim 3, wherein the fourth transistor is configured to flow current from an output of the power converter, wherein the current flowing through the third transistor incudes at least a portion of the current flowing through the fourth transistor.

5. The apparatus of claim 3, wherein the current mirror comprises fifth and sixth transistors each having a gate, a drain, and a source, wherein the sources of the fifth and sixth transistors are configured to flow current from an output of the power converter, wherein the drain of the fifth transistor is operatively coupled to the drain of the fourth transistor, wherein the drain of the sixth transistor is operatively coupled to the first resistor, and wherein the gates of the fifth and sixth transistors are operatively coupled to the source of the fifth transistor such that the sixth transistor is configured to mirror current flowing through the fifth transistor.

6. The apparatus of claim 5, wherein the current sensing circuit further comprises a seventh transistor having a gate, a source, and a drain, wherein the gate of the seventh transistor is operative coupled to the output of the first amplifier, wherein the source of the seventh transistor is configured to receive a voltage corresponding to a voltage of the source of the fourth transistor, wherein the drain of the seventh transistor is operative coupled to the current mirror, and wherein the seventh transistor is a scaled version of the fourth transistor.

7. The apparatus of claim 6, wherein the current sensing circuit further comprises a second amplifier having first and second inputs and an output, wherein the first input of the second amplifier is operatively coupled to the drain of the fifth transistor and the drain of the seventh transistor, wherein the second input of the second amplifier is operatively coupled to the drain of the fourth transistor, wherein the output of the second amplifier is operatively coupled to the gate of the fifth transistor in a feedback loop.

8. The apparatus of claim 7, wherein the second amplifier is configured to match a voltage of the drain of the seventh transistor with a voltage of the drain of the fourth transistor.

9. The apparatus of claim 1, wherein the first circuit further comprises:
a first amplifier having first and second inputs and an output, wherein the first input of the first amplifier is configured to receive a voltage corresponding to a voltage of the source of the second transistor;
a fourth transistor having a gate, a drain, and a source, wherein the gate of the fourth transistor is operatively coupled to the output of the first amplifier, and wherein the drain is configured to flow current from an output of the power converter; and
second and third resistors each having first and second ends, wherein the first end of the second resistor is operatively coupled to a drain of the second transistor, wherein the second end of the second resistor is operatively coupled to the second input of the first amplifier, wherein the first end of the third resistor is operatively coupled to second end of the second resistor and the second input of the first amplifier, wherein the second end of the third resistor is operatively coupled to the drain of the third transistor, and wherein the second end of the third resistor is further operatively coupled to the source of the fourth transistor in a feedback loop.

10. The apparatus of claim 1, wherein the first circuit comprises:
a first amplifier having first and second inputs and an output, wherein the first input of the first amplifier is configured to receive a voltage corresponding to a voltage of a source of the second transistor;
a voltage divider having a first end, a second end, and an intermediate node, the first end operatively coupled to a drain of the second transistor, the second end operatively coupled to the drain of the third transistor, the intermediate node operatively coupled to the second input of the first amplifier; and
a fourth transistor having a gate, a drain, and a source, wherein the gate of the fourth transistor is operatively coupled to the output of the first amplifier, wherein the source of the fourth transistor is coupled to the second end of the voltage divider such that a voltage at the drain of the third transistor is equal in magnitude but opposite in polarity to a voltage of a drain of the second transistor.

11. The apparatus of claim 1, further comprising an offset current source configured to provide an offset current to the first resistor, and wherein the first resistor is configured to convert the offset current and the mirrored current to the current sensed signal.

12. The apparatus of claim 1, wherein the current sensed signal is a voltage signal.

13. A method of sensing a current of a power converter, the method comprising:

supplying the current of the power converter using a first supply;

providing a gate of a sensing transistor with a voltage corresponding to a gate voltage of a power transistor of the power converter, wherein the sensing transistor is a scaled version in width relative to the power transistor;

controlling a drain-to-source voltage of the sensing transistor to match a drain-to-source voltage of the power transistor, wherein a polarity of the drain-to-source voltage determines a direction of current flow through the sensing transistor;

generating an output current based at least partly on current flowing through the sensing transistor by using a current mirror such that the output current is a scaled version of the current flowing through the sensing transistor;

supplying the output current using a second supply; and converting the output current to a current sensed signal by using a first resistor.

14. The method of claim 13, further comprising supplying the sensing transistor current from an output of the power converter.

15. The method of claim 13, wherein controlling the drain-to-source voltage comprises:

controlling a voltage of a source of the sensing transistor by providing a first circuit with a voltage corresponding to a voltage of a source of the power transistor, wherein the first circuit comprises a first amplifier and a third transistor, the first amplifier having first and second inputs and an output, the third transistor having a gate, a drain, and a source, wherein the first input of the first amplifier receives the voltage corresponding to the voltage of the source of the power transistor, wherein the second input of the first amplifier is operatively coupled to the source of the sensing transistor, wherein the gate of the third transistor is operatively coupled to the output of the first amplifier, and wherein the source of the third transistor is operatively coupled to the second input of the first amplifier and the source of the sensing transistor; and supplying the third transistor current from an output the power converter.

16. The method of claim 13, wherein controlling the drain-to-source voltage comprises:

controlling a voltage of a source of the sensing transistor by providing a first circuit with a voltage corresponding to a voltage of a source of the power transistor, wherein the first circuit comprises a first amplifier, a voltage divider, and a third transistor, the first amplifier having first and second inputs and an output, the voltage divider having a first end, a second end, and an intermediate node, the third transistor having a gate, a drain, and a source, wherein the first input of the first amplifier is configured to receive the voltage corresponding to the voltage of the source of the power transistor, wherein the first end of the voltage divider is operatively coupled to a drain of the power transistor, wherein the second end of the voltage divider is operatively coupled to the drain of the third transistor, wherein the intermediate node of the voltage divider is operatively coupled to the second input of the first amplifier, wherein the gate of the third transistor is operatively coupled to the output of the first amplifier, wherein the source of the third transistor is coupled to the second end of the voltage divider such that a voltage at the drain of the sensing transistor is equal in magnitude but opposite in polarity to a voltage of a drain of the power transistor.

17. The method of claim 13, further comprising supplying current to the current mirror from an output of the power converter for providing at least a portion of the current flowing through the third transistor and for providing at least a portion of the mirrored current.

18. The method of claim 13, further comprising:

providing the first resistor an offset current by using an offset current source; and converting the offset current to a component of the current sensed signal by using the first resistor.

19. The method of claim 13, wherein the current sensed signal is a voltage signal.

20. An apparatus for sensing a current of a power converter, the apparatus comprising:

means for supplying power to the power converter using a first supply;

means for providing a gate of a sensing transistor a voltage corresponding to a gate voltage of a power transistor of the power converter, wherein the sensing transistor is a scaled version in width relative to the power transistor;

means for controlling a drain-to-source voltage of the sensing transistor to match a drain-to-source voltage of the power transistor;

means for controlling a current flow direction in the sensing transistor by controlling a polarity of the drain-to-source voltage of the sensing transistor to be same polarity or the reverse polarity as that of the drain-to-source voltage of the power transistor;

means for generating an output current based at least partly on current flowing through the sensing transistor, wherein the output-current generating means includes a current mirror such that the output current is a scaled version of the current flowing through the sensing transistor and such that the output current is provided by a second supply; and means for converting the output current to a current sensed signal.

* * * * *